(12) United States Patent
Shin

(10) Patent No.: US 7,510,952 B2
(45) Date of Patent: Mar. 31, 2009

(54) SINGLE CRYSTALLINE STRUCTURE, METHOD OF FORMING THE SAME, SEMICONDUCTOR DEVICE HAVING THE SINGLE CRYSTALLINE STRUCTURE, AND METHOD OF MANUFACTURING THE SEMICONDUCTOR DEVICE

(75) Inventor: Hye-Soo Shin, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 120 days.

(21) Appl. No.: 11/335,031

(22) Filed: Jan. 18, 2006

(65) Prior Publication Data
US 2006/0157708 A1   Jul. 20, 2006

(30) Foreign Application Priority Data
Jan. 20, 2005   (KR) ............... 10-2005-0005250

(51) Int. Cl.
*H01L 29/72* (2006.01)
(52) U.S. Cl. .................. 438/479; 438/493; 438/700; 438/702; 257/334; 257/367
(58) Field of Classification Search ........ 438/479, 438/493, 700, 702; 257/334, 367
See application file for complete search history.

(56) References Cited
U.S. PATENT DOCUMENTS 5,554,870 A * 9/1996 Fitch et al. ............... 257/334

6,376,130 B1 * 4/2002 Stanton ..................... 430/5

FOREIGN PATENT DOCUMENTS

JP    05-136060       6/1993
KR    2004-0015651   2/2004

OTHER PUBLICATIONS

English language abstract of Korean Publication No. 2004-0015651.
English language abstract of Japan Publication No. 05-136060.

* cited by examiner

*Primary Examiner*—Edward Wojciechowicz
(74) *Attorney, Agent, or Firm*—Marger Johnson & McCollom, P.C.

(57) ABSTRACT

A single crystalline structure includes a first insulation interlayer pattern, a first epitaxial layer pattern, a second insulation interlayer pattern, and a second epitaxial layer pattern. The first insulation interlayer pattern includes a contact hole that exposes a single crystalline seed. The first epitaxial layer pattern fills up the contact hole. The second insulation interlayer pattern is formed on the first insulation interlayer pattern and the first epitaxial layer pattern. The second insulation interlayer pattern has a trench that partially exposes the first epitaxial layer pattern and has an end disposed over an upper surface of the first epitaxial layer pattern. The second epitaxial layer pattern fills up the trench. Thus, voids are not generated in the second epitaxial layer pattern and a semiconductor device having the single crystalline structure exhibits improved reliability.

13 Claims, 10 Drawing Sheets

SINGLE CRYSTALLINE STRUCTURE, METHOD OF FORMING THE SAME, SEMICONDUCTOR DEVICE HAVING THE SINGLE CRYSTALLINE STRUCTURE, AND METHOD OF MANUFACTURING THE SEMICONDUCTOR DEVICE

CROSS-REFERENCE TO RELATED APPLICATIONS

This application claims priority from Korean Patent Application No. 10-2005-0005250, filed on 20 filed on 20 Jan. 2005. Korean Patent Application No. 10-2005-0005250 is incorporated by reference in its entirety.

BACKGROUND

1. Technical Field

This disclosure relates to a single crystalline structure, a method of forming the same, a semiconductor device having the single crystalline structure, and method of manufacturing the semiconductor device. More particularly, the disclosure relates to a single crystalline structure having a shape that is suitable for vertically stacking semiconductor unit elements, a method of forming the single crystalline structure, a semiconductor device having the single crystalline structure, and a method of manufacturing the semiconductor device.

2. Description of the Related Art

To continuously improve an integration degree of a semiconductor device, a line width of a pattern formed on a semiconductor chip and/or an interval between two adjacent patterns has been gradually narrowed. Generally, when the line width or the interval of the patterns is gradually narrowed, an electrical resistance of the patterns is greatly increased. Thus, there is a limit in increasing the integration degree by reducing the size of the pattern. To highly integrate the semiconductor device, a vertically stacked semiconductor device having a plurality of the semiconductor unit elements that are vertically stacked on a semiconductor substrate has been recently developed.

To manufacture the vertically stacked semiconductor device, an active region is formed in a predetermined region of the semiconductor substrate. A single crystalline structure used for the active region is formed on the semiconductor substrate. An example of the single crystalline structure includes a single crystalline silicon material.

To form the single crystalline structure on the active region, a selective epitaxial growth (SEG) process for forming a single crystalline silicon layer on the semiconductor substrate as a seed and a chemical mechanical polishing (CMP) process for planarizing the single crystalline silicon layer are performed.

A conventional method of manufacturing a single crystalline silicon structure by an SEG process is disclosed in U.S. Pat. No. 5,554,870,to Fitch, et al. ("Fitch"). In the conventional method disclosed by Fitch, after forming an insulation pattern having an opening that exposes a seed, a source gas is provided onto the seed so that an epitaxial layer including a single crystalline silicon material grows on the seed.

However, when the conventional epitaxial layer grows on the seeds, a portion of the epitaxial layer frequently makes contact with an inside wall of the opening of the insulation pattern. When the portion of the epitaxial layer makes contact with the inside wall of the opening, the source gas is not provided to a region under a contact region where the inside wall and the epitaxial layer make contact.

FIG. 1 is a cross sectional diagram illustrating a single crystalline silicon structure formed by the conventional epitaxial growth method. Referring to FIG. 1, an insulating pattern 12 is formed on a semiconductor substrate 10. When an epitaxial layer 14 is grown on the structure as a single crystalline silicon structure, a void 20 is generated in the lower region because a source gas is not provided into the lower region. The reliability of semiconductor devices having the void 20 may be greatly reduced.

Embodiments of the invention address these and other disadvantages of the conventional art.

SUMMARY OF THE INVENTION

Embodiments of the invention provide a single crystalline structure suitable for forming a vertically stacked semiconductor device, a method of forming the single crystalline structure, a semiconductor device having the single crystalline structure, and a method of manufacturing the semiconductor device having the single crystalline structure.

BRIEF DESCRIPTION OF THE DRAWINGS

The above and other features and advantages of the invention will become more apparent by describing in detail exemplary embodiments of the invention with reference to the accompanying drawings, in which.

DETAILED DESCRIPTION

Figure 1:
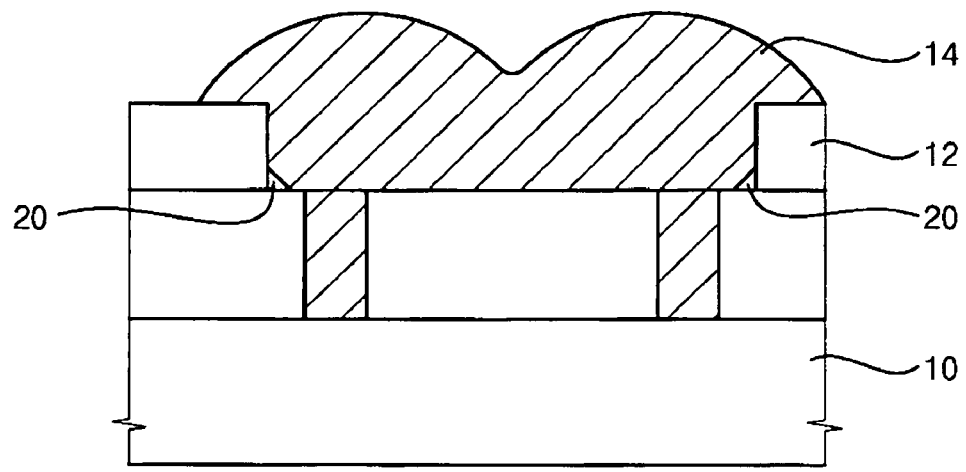
FIG. 1 is a sectional diagram illustrating a single crystalline structure formed by a conventional selective epitaxial growth method.

The invention is described more fully hereinafter with reference to the accompanying drawings, in which exemplary embodiments of the invention are shown. This invention may, however, be embodied in many different forms and should not be construed as limited to the embodiments set forth herein.

Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
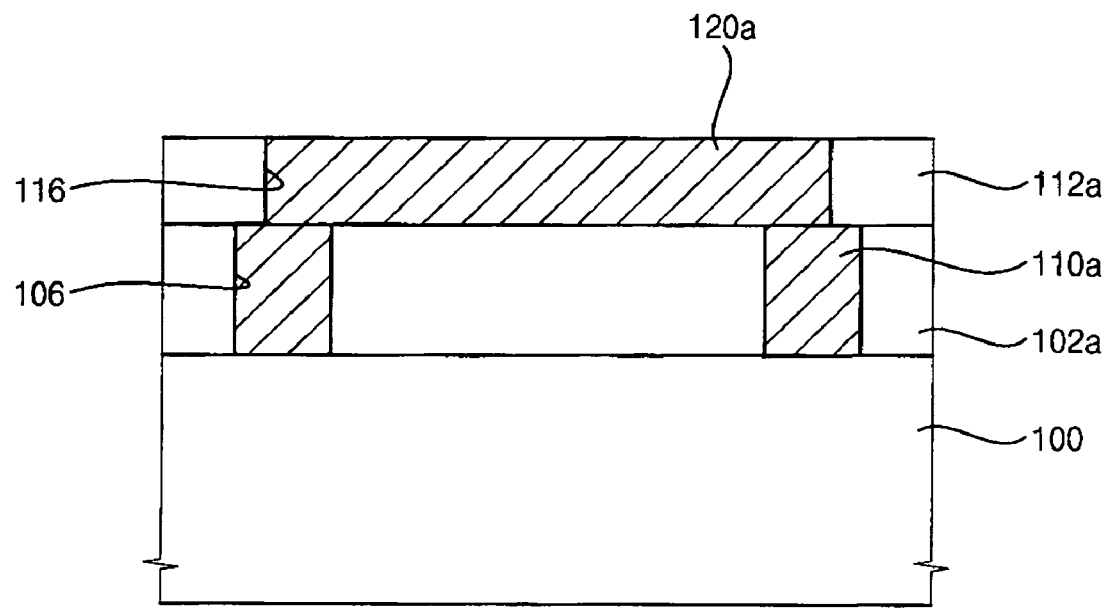
FIG. 2 is a sectional diagram illustrating a single crystalline structure in accordance with some embodiments of the invention.
Figure 3:
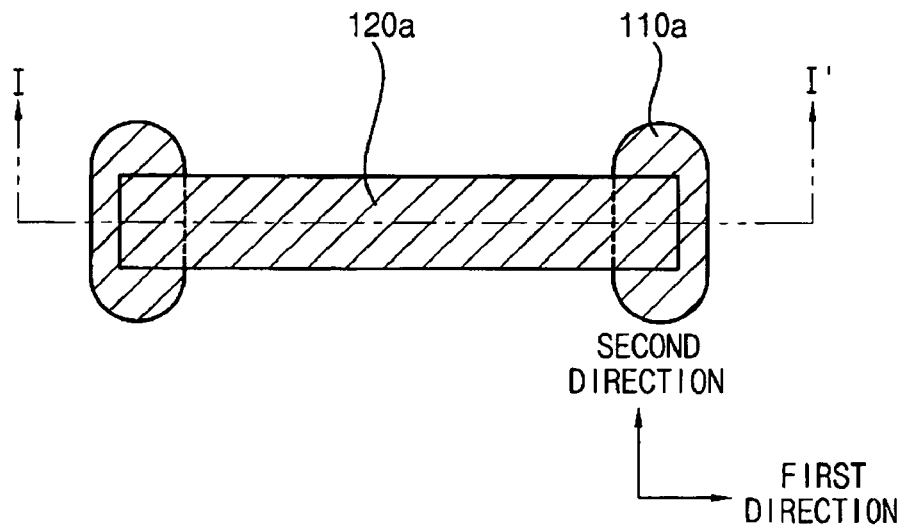
FIG. 3 is a plan diagram further illustrating the single crystalline structure of FIG. 2.
Figure 4:
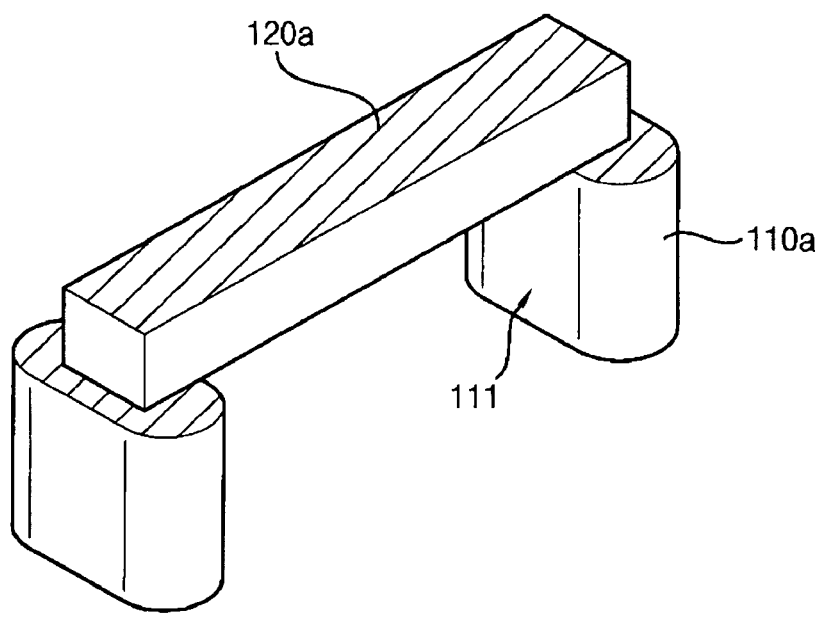
FIG. 4 is a perspective diagram further illustrating the single crystalline structure of FIG. 2.

FIG. 2 is a sectional diagram illustrating a single crystalline structure in accordance with some embodiments of the invention. FIG. 3 is a plan diagram further illustrating the single crystalline silicon structure of FIG. 2. FIG. 4 is a perspective diagram further illustrating the single crystalline structure of FIG. 2. In FIGS. 3 and 4, the insulation interlayers shown in FIG. 2 are omitted for clarity.

Referring to FIGS. 2, 3 and 4, a first insulation interlayer pattern 102a having at least two contact holes 106 for exposing a surface of a semiconductor substrate 100 is disposed on the semiconductor substrate 100. The semiconductor substrate 100 may include a silicon substrate, a silicon-on-insulator (SOI) substrate, etc. The first insulation interlayer pattern 102a may include a silicon oxide material. Examples of a material that can be used for the first insulation interlayer pattern 102 include a high-density plasma (HDP) oxide, a borophosphosilicate glass (BPSG), etc.

Each of the contact holes 106 has at least one flat side surface. That is, each of the contact holes 106 has at least one sidewall that is substantially planar. In the illustrated embodiments, the contact hole 106 has two first flat side surfaces that are arranged parallel to each other and opposite to each other. The contact hole 106 also has two second rounded side surfaces, the two second rounded side surfaces arranged opposite to each other, and each of the two second rounded side surfaces connecting ends of the two first flat side surfaces.

In alternative embodiments, each of the contact holes 106 may have two pairs of flat side surfaces, or a total of four flat side surfaces per contact hole. In this case, the contact holes 106 would have a square or rectangular shape.

Since each of the contact holes 106 has at least one first flat surface, a misalignment margin of the contact holes 106 with respect to a trench formed on the contact holes 106 is greatly increased.

A first epitaxial layer pattern 110a is formed in the contact holes 106. The first epitaxial layer pattern 110a may include a single crystalline silicon material formed by the selective epitaxial growth (SEG) process. The first epitaxial layer pattern 110a has a flat upper surface that is substantially coplanar with a flat upper surface of the first insulation interlayer pattern 102a.

The first epitaxial layer pattern 110a has at least one flat side surface 111 that corresponds to the flat side surface of the contact holes 106. In the illustrated embodiments, the first epitaxial layer pattern 110a has two first flat side surfaces 111 (see FIG. 4) that face each other and two second rounded side surfaces that face each other and extend from the first flat surfaces.

In alternative embodiments, the first epitaxial layer pattern 110a may have two pairs of flat side surfaces, or a total of four flat side surfaces. In this case, the first epitaxial layer pattern 10a would have a square or rectangular shape.

A second insulation interlayer pattern 112a is disposed on the first epitaxial layer pattern 110 and the first insulation interlayer pattern 102a. The second insulation interlayer pattern 112a has a trench 116 that extends along a first direction and that partially exposes an upper surface of at least two of the first epitaxial layer patterns 110a. Thus, a sidewall of the trench 116 is disposed on the upper surface of the first epitaxial pattern 110a.

As illustrated in FIGS. 2 and 3, the upper surfaces of the first epitaxial layer patterns 110a extend past the ends of the trench 116 in a first direction. FIG. 3 also illustrates that the upper surfaces of the first epitaxial layer patterns 110a extend past the ends of the trench 116 in a second direction that is substantially perpendicular to the first direction. In other words, the upper surfaces of the first epitaxial layer patterns 110a overlap the ends of the trench 116. Thus, even if the trench 116 and the first epitaxial layer patterns 110a become slightly misaligned in a first direction or a second direction due to errors in the manufacturing process, defects may be prevented because of the built-in misalignment margin.

When a first linear distance measured between the inner surface of the trench 116 and the flat side surface 111 of the first epitaxial layer pattern 110a in the first direction is greater than about 30 nm, or when a second linear distance measure between the inner surface of the trench 116 and the rounded side surface of the first epitaxial layer pattern 110a in the second direction is greater than about 30 nm, it becomes difficult to highly integrate a semiconductor device. On the other hand, when the first and second linear distances are less than about 5 nm, the misalignment margin becomes too small to effectively prevent defects due to alignment errors in the manufacturing process. Thus, according to embodiments of the invention, the first and second linear distances should be in the range from about 5 nm to about 30 nm.

A second epitaxial layer pattern 120a is formed in the trench 116. The second epitaxial layer pattern 120a, for example, has a bar shape for connecting at least two first epitaxial layer patterns 110a to each other. The second epitaxial layer pattern 120a may include a single crystalline silicon material formed by an SEG process. The second epitaxial layer pattern 120a has a flat upper surface that is substantially coplanar with the flat upper surface of the second insulation interlayer pattern 112a. Alternatively, the second epitaxial layer pattern 120a may include a silicon material formed by an SEG process.

Due to the alignment of the trench 116 that was described above, the second epitaxial layer pattern 120a partially covers the upper surfaces of at least two of the first epitaxial layer patterns 110a so that the at least two first epitaxial layer patterns 110a are electrically connected to each other through the second epitaxial layer pattern 120a. Thus, the silicon crystalline structure grows only in a vertical direction that is substantially perpendicular to a bottom surface of the trench 116, and not in a horizontal direction. Thus, since the second epitaxial layer pattern 120a completely fills up the lower edge portion of the trench 116 while the first epitaxial layer pattern 120a grows, voids are prevented from forming in the lower edge portion of the trench 116.

Figure 5:
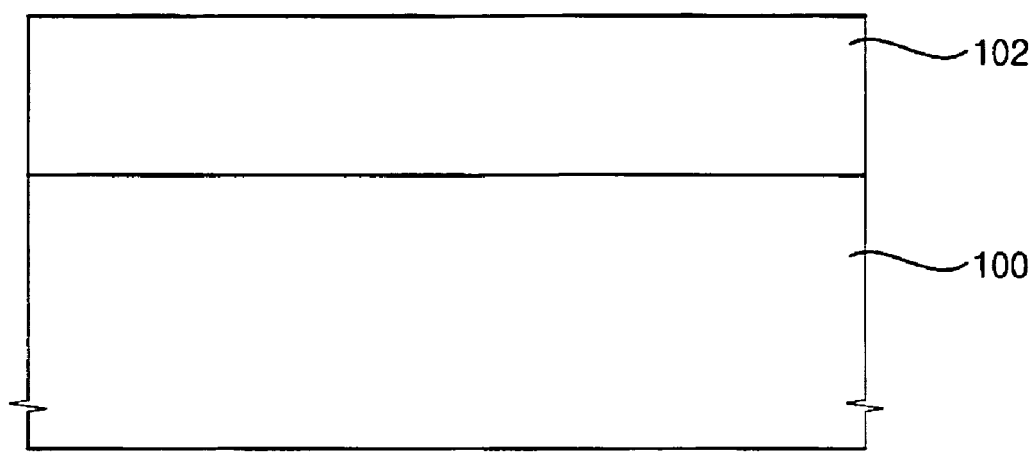
FIGS. 5 and 6 are sectional diagrams illustrating a method of forming the single crystalline structure of FIG. 2.
Figure 6:
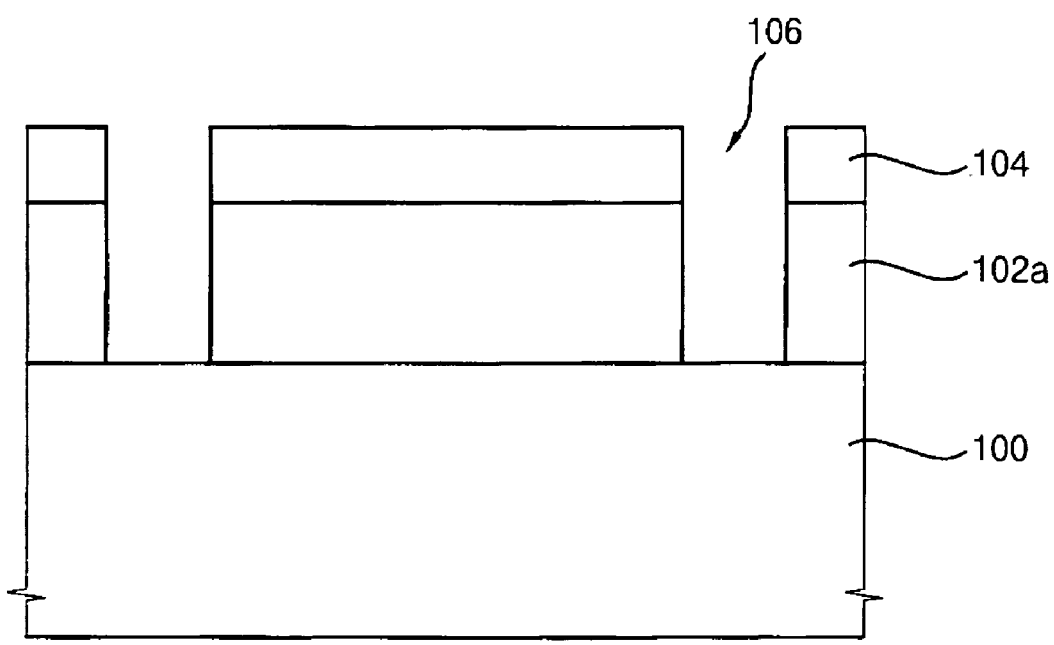

FIGS. 5 and 6 are sectional diagrams illustrating a method of manufacturing the single crystalline structure of FIG. 2.

Referring to FIG. 5, the first insulation interlayer 102 is formed on the semiconductor substrate 100. The semiconductor substrate 100 may include a silicon substrate, a silicon-on-insulator (SOI) substrate, etc. A silicon oxide material may be deposited by a chemical vapor deposition (CVD) process on the semiconductor substrate 100 to form the first insulation interlayer 102 on the semiconductor substrate 100.

In particular, the silicon oxide material may be deposited on the substrate 100 by a high-density plasma chemical vapor deposition (HDP-CVD) process to form the first insulation interlayer 102 on the semiconductor substrate 100. In alternative embodiments, a borophosphosilicate glass (BPSG) material may be deposited on the substrate 100 by a CVD process to form the first insulation interlayer 102 on the semiconductor substrate 100.

Referring to FIG. 6, a first photoresist film (not shown) is formed on the first insulation interlayer 102. The first photoresist layer is exposed and developed using a first reticle (not shown) to form a first photoresist pattern 104 on the first insulation interlayer 102. Next, the first insulation interlayer 102 is partially etched using the photoresist pattern as an etching mask to form a first insulation interlayer pattern 102a having a contact hole 106 that partially exposes a surface of the semiconductor substrate 100. In the illustrated embodiments, the first contact hole 106 has at least one flat surface.

Figure 7:
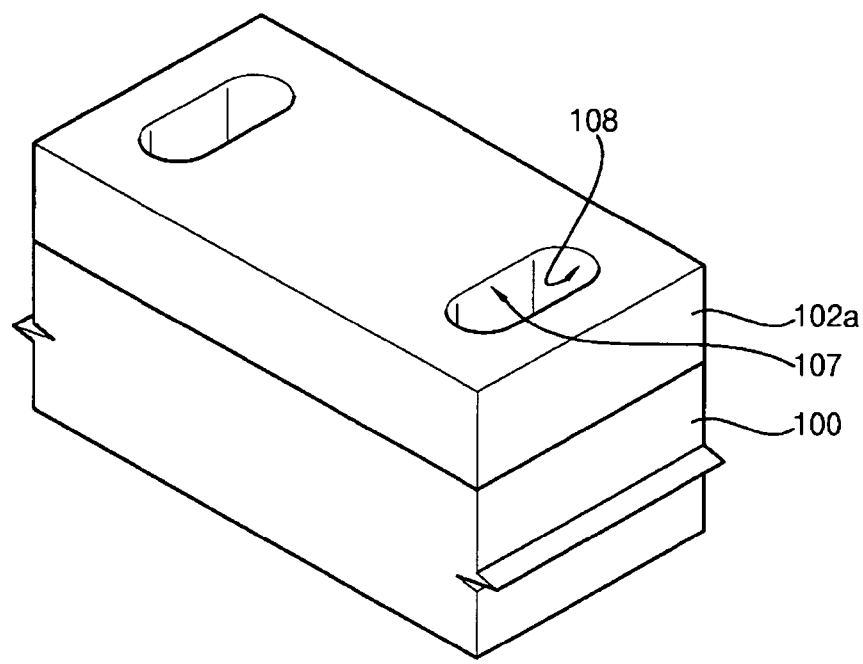
FIGS. 7 and 8 are perspective diagrams further illustrating the contact holes of FIG. 6.
Figure 8:
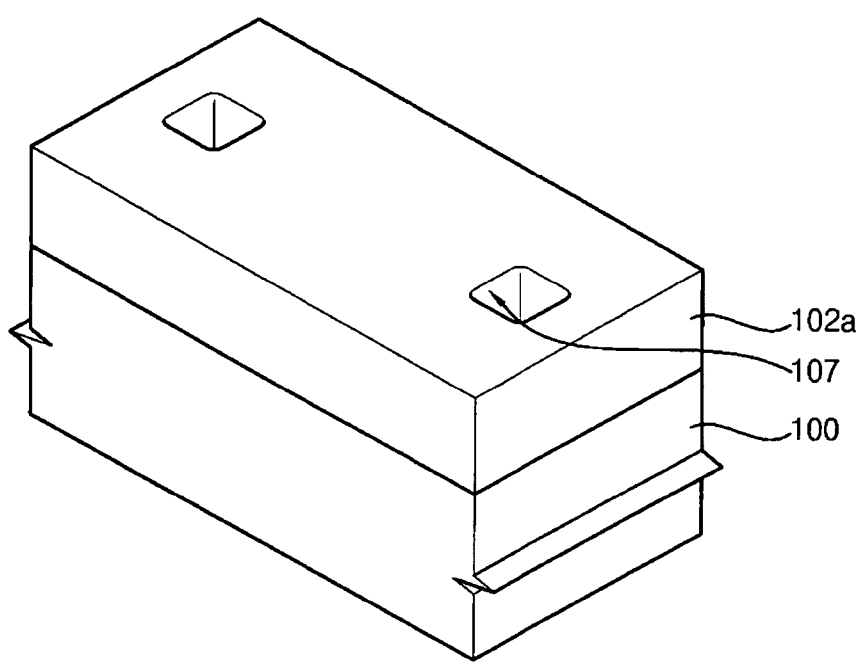

FIGS. 7 and 8 are perspective diagrams further illustrating the contact holes 106 of FIG. 6.

Referring to FIG. 7, the contact hole 106 may have two flat side surfaces 107 facing each other, and two rounded side surfaces 108 facing each other that extend from the flat side surfaces, respectively. Alternatively, as shown in FIG. 8, the contact hole 106 may have two pairs of flat side surfaces 107. Two flat side surfaces 107 of each pair face each other.

Since each of the contact holes 106 has at least one flat side surface 107, a misalignment margin between the contact holes 106 and a trench formed on the contact holes 106 may be greatly increased.

To form the contact hole 106 having at least one flat side surface 107, a pattern layout for forming the contact hole 106 may be adjusted.

Figure 9:
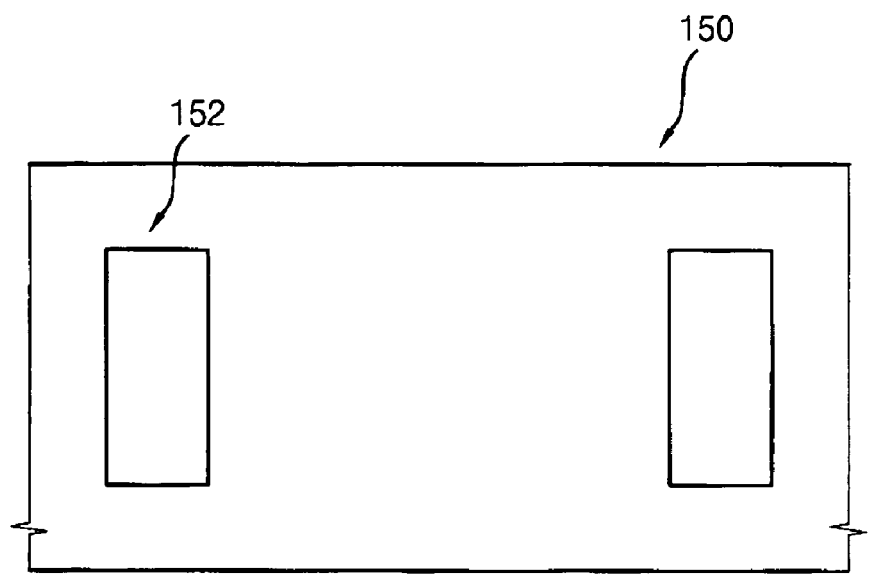
FIGS. 9 and 10 are plan diagrams illustrating first reticles that may be used to form the contact holes of FIGS. 7 and 8.
Figure 10:
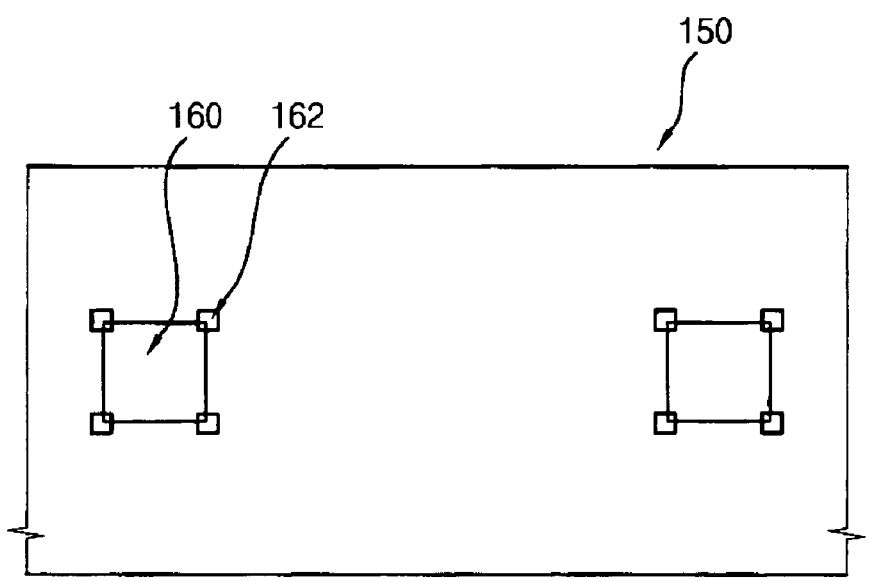

FIGS. 9 and 10 are plan diagrams illustrating first reticles that may be used to form the contact holes of FIGS. 7 and 8, respectively.

Referring to FIG. 9, to form the contact hole 106 illustrated in FIG. 7, the first reticle 150 has a rectangular opening 152 corresponding to a region where the contact hole 106 is formed.

Referring to FIG. 10, to form the contact hole 106 illustrated in FIG. 8, the first reticle 150 has a square opening 160 and optical proximity effect correction (OPEC) patterns 162 that are formed at each of the corner portions of the opening 160.

Although two specific shapes for the contact holes 106 have been described in the illustrated embodiments, it should be evident that various other shapes may be used.

After forming the contact hole 106, the first photoresist pattern 104 is removed by an ashing process using $O_2$ plasma and/or a strip process.

In addition, a surface of the exposed substrate 100 may be treated using a hydrofluoride (HF) solution to remove a thin natural oxide layer and a hydrogen passivation layer on the semiconductor substrate 100.

Figure 11:
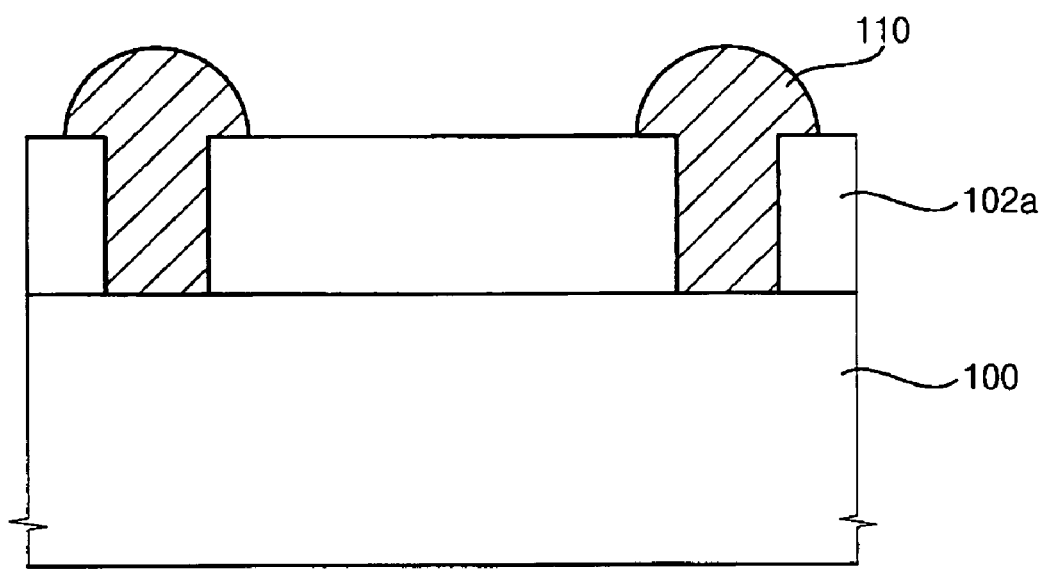
FIGS. 11, 12 and 13 are sectional diagrams further illustrating a method of forming the single crystalline structure of FIG. 2.
Figure 12:
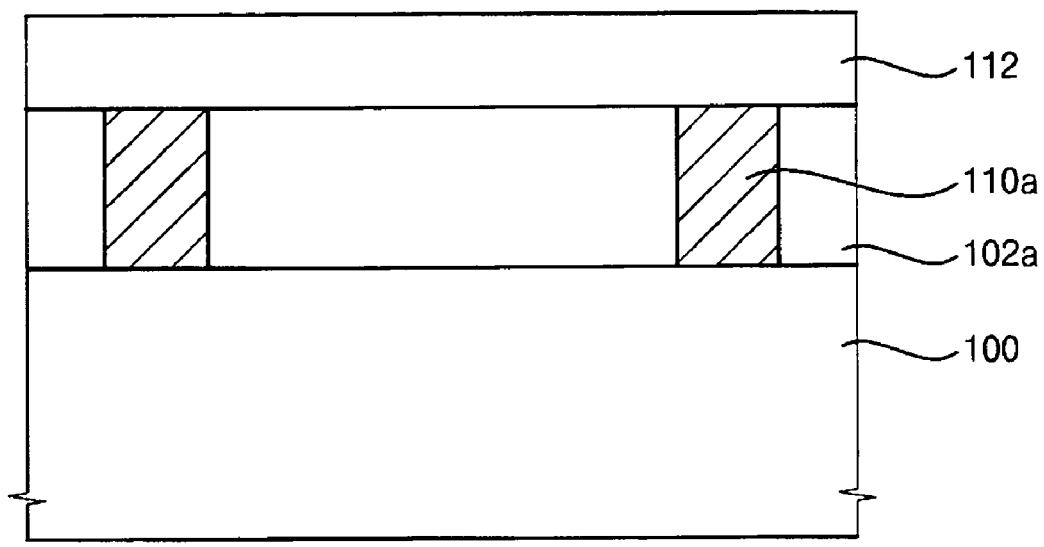
Figure 13:
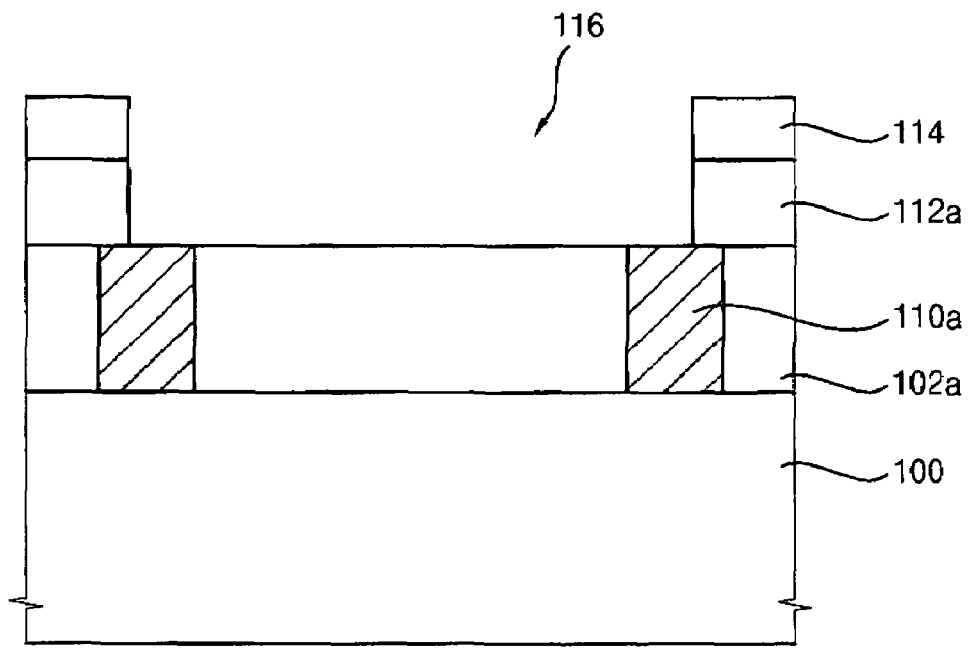

FIGS. 11, 12 and 13 are sectional diagrams further illustrating a method of forming the single crystalline structure of FIG. 2.

Referring to FIG. 11, single crystalline silicon grows from the surface of the exposed semiconductor substrate 100 as a seed by an SEG process to form a first preliminary epitaxial layer pattern 110 in the contact hole 106 and on portions of the upper surface of the first insulation interlayer pattern 102a.

Here, in FIG. 11, the first preliminary epitaxial layer patterns 110 growing from each of the surfaces of the exposed semiconductor substrate 100 are separated from each other.

Alternatively, the first preliminary epitaxial layer patterns 110 may be connected to each other.

When a process temperature for forming the first preliminary epitaxial layer pattern 110 is below about 750° C., the first preliminary epitaxial layer pattern 110 does not easily grow from the surface of the exposed semiconductor substrate 100. On the other hand, when a process temperature for forming the first preliminary epitaxial layer pattern 110 is above about 1,250° C., the growth of the first preliminary epitaxial layer pattern 110 is not readily controlled and a semiconductor structure formed on the semiconductor substrate 100 may also be damaged.

Thus, according to embodiments of the invention, a process temperature for forming the first preliminary epitaxial layer pattern 110 is preferably about 750° C. to about 1,250° C., more preferably about 800° C. to about 900° C.

Meanwhile, when the first preliminary epitaxial layer pattern 110 is formed on the substrate 100, a reaction gas may be provided onto the first insulation interlayer pattern 102a. The reaction gas includes a silicon source gas. Examples of the silicon source gas include a silicon tetrachloride ($SiCl_4$) gas, a dichlorosilane (DCS; $SiH_2Cl_2$) gas, a silane ($SiH_4$) gas, a trichlorosilane ($SiHCl_3$) gas, etc. These can be used alone or in a combination thereof. In this example embodiment, the silicon tetrachloride ($SiCl_4$) gas as the reaction gas is mainly used.

In this example embodiment, the reaction gas having the silicon source gas is provided onto the semiconductor substrate 100 at a temperature of about 750° C. to about 1,250° C. to grow the first preliminary epitaxial layer pattern 110 from the surface of the exposed semiconductor substrate 100. The first preliminary epitaxial layer pattern 110 completely fills up the contact holes 106 to grow upon the upper surface of the first insulation interlayer pattern 102a.

The first preliminary epitaxial layer pattern 110 anisotropically grows in the contact hole 106 in a vertical direction substantially perpendicular to the surface of the semiconductor substrate 100. After completely filling the contact hole 106 with the first preliminary epitaxial layer pattern 110, the first preliminary epitaxial layer pattern 110 grows in a horizontal direction to partially cover the upper surface of the first insulation interlayer pattern 102a.

Referring to FIG. 12, the first preliminary epitaxial layer pattern 110 is planarized by a CMP process or an etch-back process to form a first epitaxial layer pattern 110a in the contact hole 106. In this example embodiment, for example, an upper surface of the first epitaxial layer pattern 110a and the upper surface of the first insulation interlayer pattern 102a are substantially coplanar.

Next, the second insulation interlayer 112 is formed on the first epitaxial layer pattern 110a and the first insulation interlayer pattern 102a. Silicon oxide may be deposited by a CVD process to form the second insulation interlayer 112 on the first epitaxial layer pattern 110a and the first insulation interlayer pattern 102a. In particular, silicon oxide material may be deposited by a high-density plasma chemical vapor deposition (HDP-CVD) process to form the second insulation interlayer 112. In alternative embodiments, a borophosphosilicate glass (BPSG) material may be deposited on the first insulation interlayer pattern 102 by a CVD process to form the second insulation interlayer 112.

Figure 14:
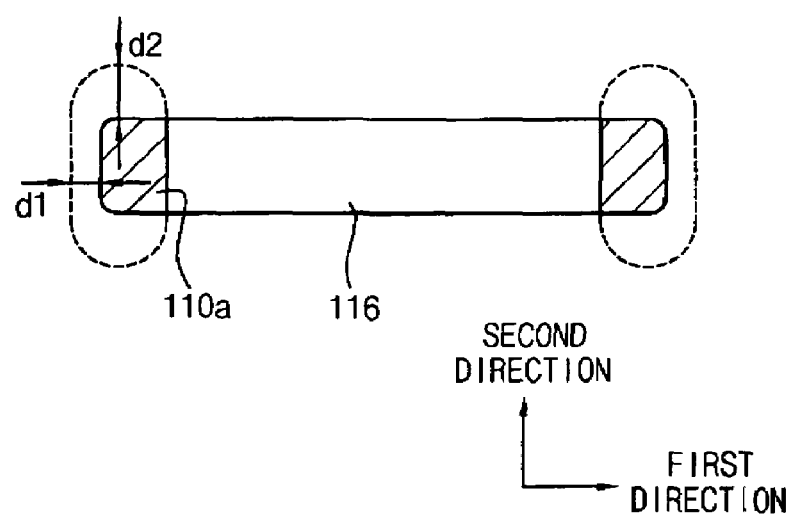
FIG. 14 is a plan diagram illustrating a first epitaxial layer pattern and a trench used to form the single crystalline structure of FIG. 2.

FIG. 14 is a plan diagram further illustrating the first epitaxial layer pattern and the trench used to form the single crystalline structure of FIG. 2.

Referring to FIGS. 13 and 14, a second photoresist film (not shown) is formed on the second insulation interlayer 112 by a spin coating process. The second photoresist film is partially exposed and developed using a second reticle (not shown) to form a second photoresist pattern 114 on the second insulation interlayer 112. The second insulation interlayer 112 is partially etched using the second photoresist pattern 114 as an etching mask to form a second insulation interlayer pattern 112a having a trench 116. The trench 116 is partially overlapped with the upper surface of the first epitaxial layer pattern 110a so that the upper surface of the first epitaxial layer pattern 110a is partially exposed through the trench 116.

According to the illustrated embodiments, the trench 116 extends along a first direction to partially expose at least two of the first epitaxial layer patterns 110a.

As seen in FIG. 14, the ends of the trench 116 are overlapped by the upper surfaces of the first epitaxial layer pattern 110a. Thus, although the end portions of the trench 116 and the first epitaxial layer pattern 110a may become slightly misaligned in a second direction that is substantially perpendicular to the first direction due to errors in the manufacturing process, the total area of the first epitaxial layer pattern 110a that is exposed by the trench 116 is hardly changed compared to the case when no misalignment occurs. Thus, defects caused by the misalignment of the trench 116 relative to the first epitaxial layer patterns 10a may be reduced.

When a first linear distance d1 measured between the inner surface of the trench 116 and the flat side surface 111 of the first epitaxial layer pattern 110a in the first direction, or when a second linear distance d2 between the inner surface of the trench 116 and the rounded side surface of the first epitaxial layer pattern 110a in the second direction is greater than about 30 nm, it becomes very difficult to highly integrate a semiconductor device. On the other hand, when the first and second linear distances d1 and d2 are less than about 5 nm, the misalignment margin becomes too small too effectively prevent defects due to misalignment errors. Thus, according to embodiments of the invention, the first and second linear distances d1 and d2 are preferably in the range of about 5 nm to about 30 nm.

After forming the trench 116, the second photoresist pattern 114 is removed by an ashing process using the $O_2$ plasma and/or a strip process.

Figure 15:
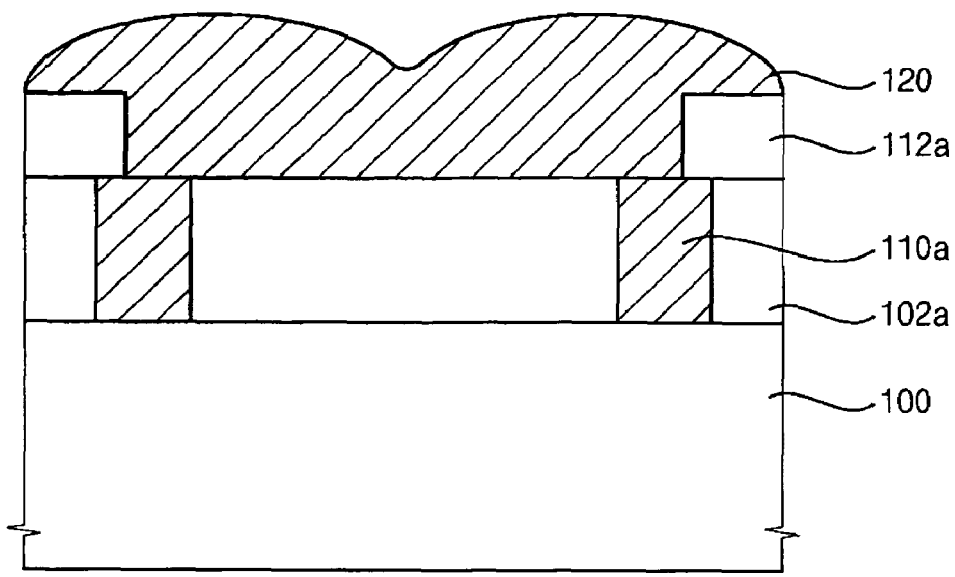
FIG. 15 is a sectional diagram further illustrating a method of forming the single crystalline structure of FIG. 2.

FIG. 15 is a sectional diagram further illustrating a method of forming the single crystalline structure of FIG. 2.

Referring to FIG. 15, single crystalline silicon selectively grows on the first epitaxial layer pattern 110a exposed through the trench 116 to form a second preliminary epitaxial layer pattern in the trench 116 and on the second insulation interlayer pattern 112a.

The second preliminary epitaxial layer pattern 120 may be formed using the first epitaxial layer pattern 110a as a seed in an SEG process so that the second preliminary epitaxial layer pattern 120 sufficiently grows in the trench 116. The SEG process for forming the second preliminary epitaxial layer pattern 120 is substantially identical to the above process for forming the first preliminary epitaxial layer pattern 110a described with reference to FIG. 11.

Meanwhile, since the upper surface of the first preliminary epitaxial layer pattern 110a is partially exposed through the trench 116 and the first insulation interlayer pattern 102 is not exposed through the trench 116, the first epitaxial layer pattern 110a only grows in the vertical direction perpendicular to a bottom surface of the first insulation interlayer 102a, and not in the horizontal direction, at bottom edge portions of the trench 116. Thus, voids caused by growth failure of the first epitaxial layer pattern 110a are not generated in the bottom edge portions of the trench 116.

Next, referring again to FIG. 2, the second preliminary epitaxial layer pattern 120 is planarized by a planarization process to form the second epitaxial layer pattern 120a. The upper surface of the second epitaxial layer pattern 120a and the upper surface of the second insulation interlayer 112a are substantially coplanar. An example of the planarizing process includes a CMP process.

The processes described above with reference to FIG. 2 and FIGS. 5 through 15 may be repeatedly performed to produce any number of the single crystalline silicon structures, one of which is illustrated in FIG. 2, where the first epitaxial layer pattern 10a and the second epitaxial layer pattern 120a are sequentially stacked.

According to the illustrated embodiments, voids are prevented from forming in the bottom edge portions of the second epitaxial layer pattern 120a. Furthermore, defects caused by the misalignment of second epitaxial layer pattern 120a with the first epitaxial layer pattern 110a, may be prevented.

Figure 16:
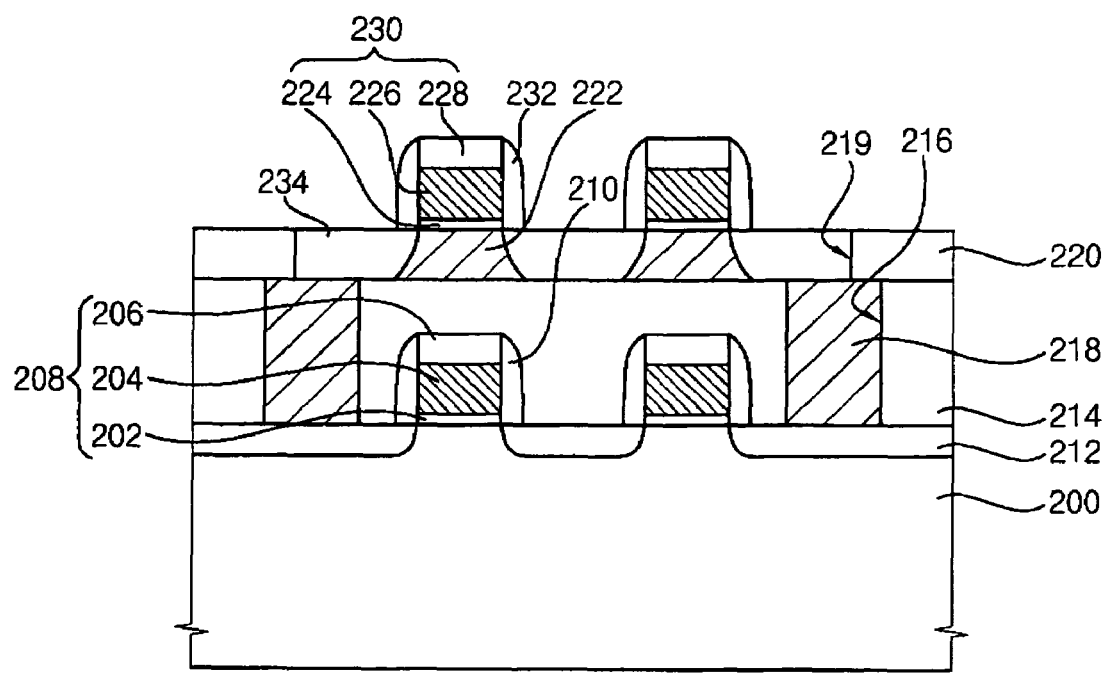
FIG. 16 is a sectional diagram illustrating a semiconductor device in accordance with some other embodiments of the invention.
Figure 17:
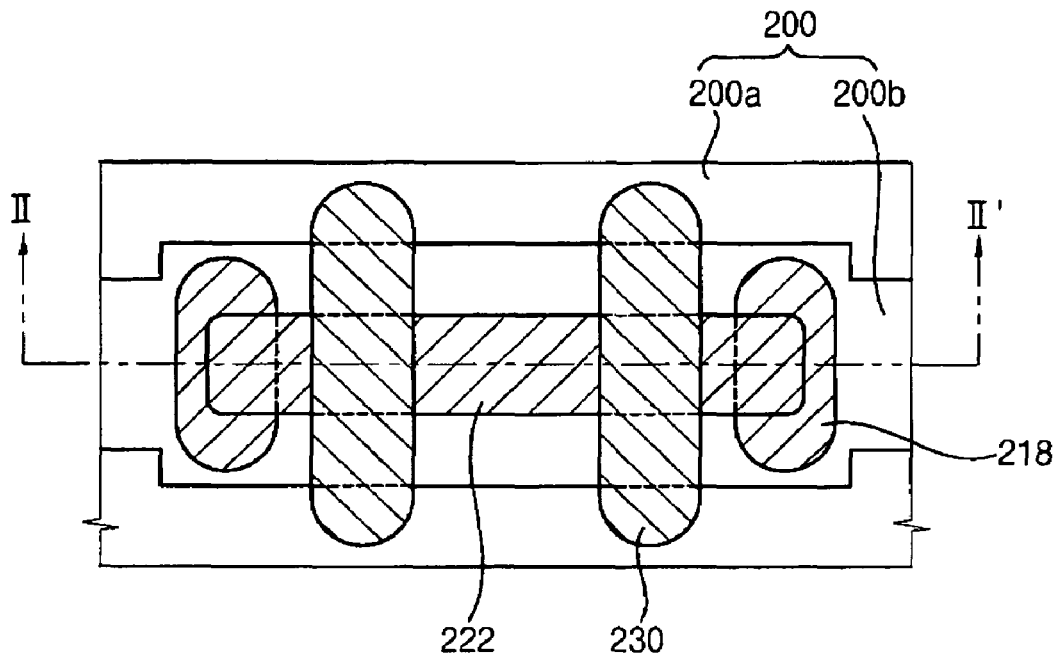
FIG. 17 is a plan diagram further illustrating the semiconductor device of FIG. 16.

FIG. 16 is a sectional diagram illustrating a semiconductor device in accordance with some other embodiments of the invention. FIG. 17 is a plan diagram further illustrating the semiconductor device of FIG. 16.

Referring to FIGS. 16 and 17, an isolation layer 200a is disposed on a substrate 200 including single crystalline silicon. A lower transistor is positioned in an active region corresponding to a region where an isolation layer 200a is not formed on the substrate 200. The lower transistor includes a first gate structure 208 and first source/drain regions 212. The lower transistor may be an N type transistor or a P type transistor.

A first insulation interlayer pattern 214 covers the lower transistor. A contact hole 216 is formed through the first insulation interlayer pattern 214 to partially expose the first source/drain regions 212 of the lower transistor.

A first epitaxial layer pattern 218 completely fills the contact hole 216. The first epitaxial layer pattern 218 may include single crystalline silicon formed by a selective epitaxial growth (SEG) process.

A second insulation interlayer pattern 220 having a trench 219 is formed on the first epitaxial layer pattern 218 and the first insulation interlayer pattern 214. The trench 219 partially exposes the upper surfaces of the first epitaxial layer patterns 218.

A second epitaxial layer pattern 222 fills the trench 219. The second epitaxial layer pattern 222 may include single crystalline silicon formed by an SEG process. The shape of the first insulation interlayer pattern 214, the first epitaxial layer pattern 218, the second insulation interlayer pattern 220, and the second epitaxial layer pattern 222 are substantially similar to the embodiments illustrated in FIGS. 2-15.

An upper transistor is disposed on the second epitaxial layer pattern 222. The upper transistor includes a second gate structure 230 and second source/drain regions 234. The upper transistor may have a conductive type that is opposite that of the lower transistor. For example, when the lower transistor is an N type transistor, the upper transistor is a P type transistor.

Since the lower and upper transistors are formed on the semiconductor substrate 200 and the second epitaxial layer pattern 222, respectively, an area of the semiconductor substrate 200 required for forming the semiconductor device may be decreased. In particular, since the lower and upper transistors have conductive types that are different from each other, it is not required to form well regions that are different from each other. Thus, since it is not required to form an additional isolation layer, the area of the substrate for forming the semiconductor device is further decreased.

Figure 18:
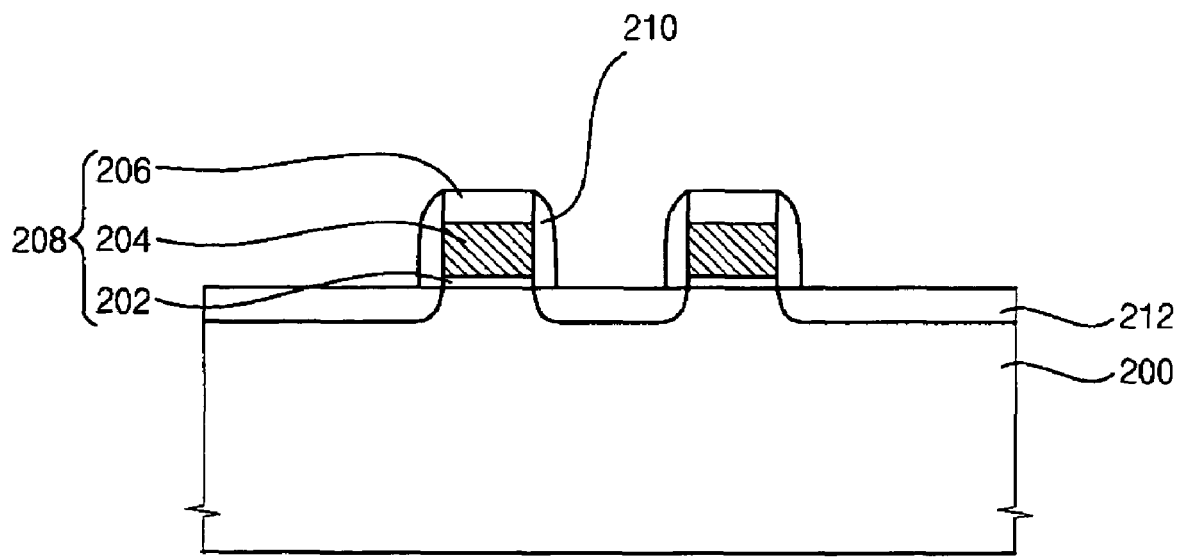
FIGS. 18, 19 and 20 are sectional diagrams illustrating a method of manufacturing the semiconductor device of FIG. 16.
Figure 19:
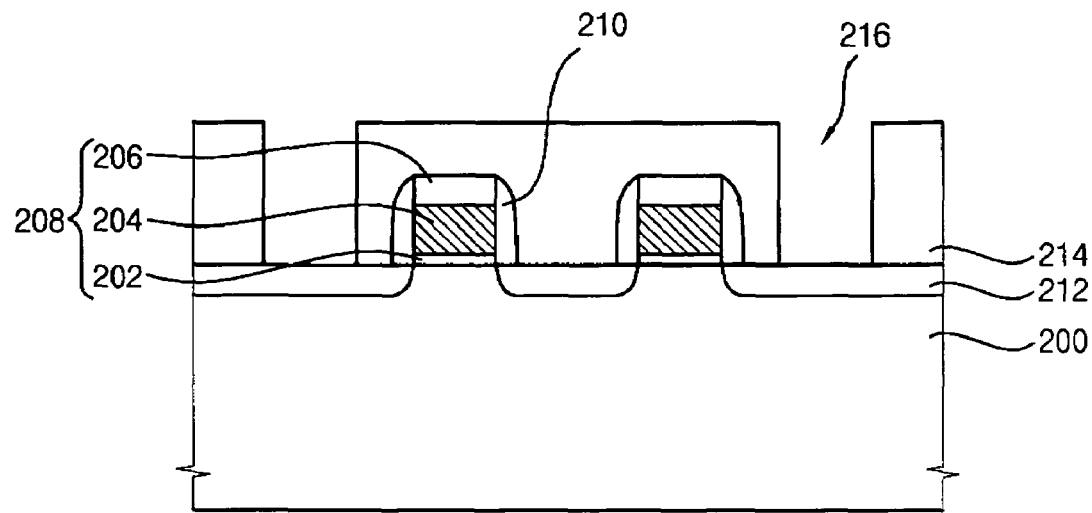
Figure 20:
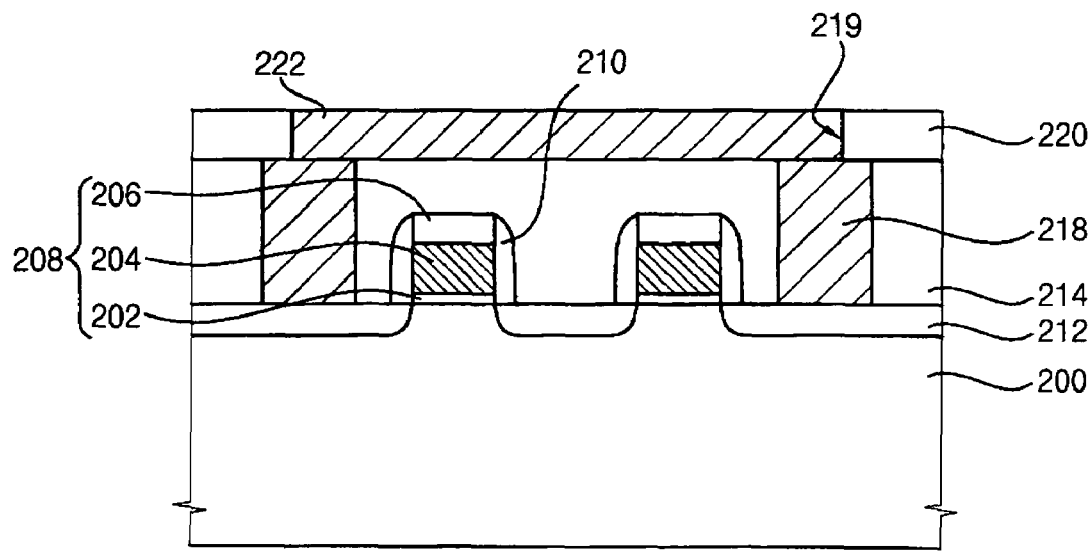

FIGS. 18, 19 and 20 are sectional diagrams illustrating a method of manufacturing the semiconductor device in FIG. 16.

Referring to FIG. 18, the isolation layer (not shown) is formed on the semiconductor substrate 200 having a single crystalline silicon surface to define a lower active region.

Next, a first gate insulation layer (not shown) is formed on the semiconductor substrate 200 corresponding to the lower active region. A first conductive layer (not shown) and a first hard mask layer (not shown) are sequentially formed on the first gate insulation layer. The first metal layer and the first hard mask layer are etched to form a first gate structure 208 including a first conductive layer pattern 204 and a first hard mask layer pattern 206. A first spacer 210 is then formed on a sidewall of the first gate structure 208. Also, impurities are implanted into exposed portions of the semiconductor substrate 200 between the first gate structures 208 to form first source/drain regions 212.

Referring to FIG. 19, a first insulation interlayer (not shown) is formed on the semiconductor substrate 200 to cover the first gate structure 208. Next, the first insulation interlayer is partially etched to form a first insulation interlayer pattern 214 having a contact hole 216 that partially exposes the first source/drain regions 212. The process for forming the contact hole 216 is carried out in the substantially same manner as in Embodiment 1 described with reference to FIGS. 6 to 10.

The above-mentioned processes described with reference to FIG. 2 and FIGS. 11-15 may be repeatedly performed so that a semiconductor device as shown in FIG. 20 is completed. Here, the first epitaxial layer pattern is represented by a reference numeral '218,' the second insulation interlayer pattern is indicated by a reference numeral '220,' and the second epitaxial layer pattern is designated by a reference numeral '222.'

Referring again to FIGS. 16 and 17, a second gate insulation layer (not shown) including oxide is formed on the second epitaxial layer pattern 222. A second conductive layer (not shown) and a second hard mask layer (not shown) are sequentially formed on the second gate insulation layer. The second conductive layer and the second hard mask layer are etched to form the second gate structure 230. The second gate structure 230 includes a second gate insulation layer pattern 224, a second conductive layer pattern 226, and a second hard mask layer pattern that are sequentially stacked. A second spacer 232 is then formed on a sidewall of the second gate structure 230. Impurities are implanted into exposed portions of the semiconductor substrate 200 between the second gate structures 230 to form second source/drain regions 234. In these embodiments, the impurities for forming the second source/drain regions 234 and the impurities for forming the first source/drain regions 212 may be substantially different from each other. A double-stacked transistor may be formed through the above-mentioned processes.

Additionally, the above-mentioned processes for forming the semiconductor device may also be utilized for a static RAM (SRAM), a logic device, etc.

According to embodiments of the invention, during the SEG process voids may be prevented from forming in the single crystalline silicon structure. Furthermore, since the semiconductor device having the vertically stacked structure may not have the voids, the semiconductor device may have improved electrical characteristics and reliability.

Embodiments of the invention may be practiced in many ways. What follows are exemplary, non-limiting descriptions of some embodiments of the invention.

According to some embodiments, a single crystalline structure includes a first insulation interlayer pattern, a first epitaxial layer pattern, a second insulation interlayer pattern, and a second epitaxial layer pattern. The first insulation interlayer pattern includes a contact hole that exposes a single crystalline seed. The first epitaxial layer pattern fills up the contact hole. The second insulation interlayer pattern is formed on the first insulation interlayer pattern and the first epitaxial layer pattern. The second insulation interlayer pattern has a trench that partially exposes the first epitaxial layer pattern and has an end placed on an upper surface of the first epitaxial layer pattern. The second epitaxial layer pattern fills up the trench.

According to some embodiments, a method of forming a single crystalline structure includes forming a first insulation interlayer on a substrate. The first insulation interlayer is partially etched to form a contact hole that partially exposes a surface of the substrate. The contact hole is filled with a first epitaxial layer pattern. A second insulation interlayer is formed on the first epitaxial layer pattern and the first insulation interlayer. The second insulation interlayer is partially etched to form a trench that partially exposes the first epitaxial layer pattern and having an end positioned in a surface portion of the first epitaxial layer pattern. The trench is then filled with a second epitaxial layer pattern.

According to some embodiments, a semiconductor device includes a lower transistor, a first insulation interlayer pattern, a first epitaxial layer pattern, a second insulation interlayer pattern, a second epitaxial layer pattern, and an upper transistor. A lower transistor is disposed on a substrate. A first insulation interlayer pattern covers the lower transistor. The first insulation interlayer pattern has a contact hole that partially exposes source/drain regions of the lower transistor. A first epitaxial layer pattern fills up the contact hole. A second insulation interlayer pattern is disposed on the first epitaxial layer pattern and the first insulation interlayer pattern. The second insulation interlayer pattern has a trench that partially overlaps the first epitaxial layer pattern to partially expose the first epitaxial layer pattern and has an end disposed in a surface portion of the first epitaxial layer pattern. A second epitaxial layer pattern fills up the trench. An upper transistor is disposed on the second epitaxial layer pattern.

According to some embodiments, a method of manufacturing a semiconductor device includes forming a first insulation interlayer on a semiconductor substrate and a lower transistor. The first insulation interlayer is partially etched to form a contact hole that partially exposes source/drain regions of the lower transistor. The contact hole is filled with a first epitaxial layer pattern. A second insulation interlayer is formed on the first epitaxial layer pattern and the first insulation interlayer. The second insulation interlayer is partially etched to form a trench that partially exposes the first epitaxial layer pattern and having an end disposed in a surface portion of the first epitaxial layer pattern. The trench is filled with a second epitaxial layer pattern. An upper transistor is then formed on the second epitaxial layer pattern.

According to the single crystalline structure of the present invention, the end of the trench is partially positioned on the first epitaxial layer pattern. Thus, since the single crystalline structure grows on the first epitaxial layer under the end of the trench as a seed, voids may not be generated in the end of the trench. As a result, when the single crystalline structure is used for an active region, a semiconductor device having improved reliability may be manufactured.

The above description is illustrative, rather than limiting, of the invention. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims.

In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

The invention claimed is:

1. A method of forming a single crystalline structure comprising:
    forming a first insulation interlayer on a semiconductor substrate;
    etching the first insulation interlayer to form a contact hole that exposes a surface of the semiconductor substrate;
    filling the contact hole with a first epitaxial layer pattern;
    forming a second insulation interlayer in contact with an upper surface of the first epitaxial layer pattern and in contact with an upper surface of the first insulation interlayer;
    etching the second insulation interlayer to form a trench that partially exposes the upper surface of the first epitaxial layer pattern at an end of the trench; and
    filling the trench with a second epitaxial layer pattern.

2. The method of claim 1, wherein etching the first insulation interlayer to form the contact hole comprises:
    forming a first photoresist film on the first insulation interlayer;
    patterning the first photoresist film using a first reticle to form a first photoresist pattern; and
    etching the first insulation interlayer using the first photoresist pattern as an etching mask to form the contact hole.

3. The method of claim 2, wherein an opening of the first reticle has a shape of an equiangular quadrilateral.

4. The method of claim 3, wherein the opening of the first reticle has the shape of an equiangular and equilateral quadrilateral, and wherein optical proximity effect correction (OPEC) patterns are disposed at corners of the opening.

5. The method of claim 1, wherein the contact hole has at least one flat side surface.

6. The method of claim 5, wherein the contact hole has two flat side surfaces and two rounded side surfaces, the two flat side surfaces arranged parallel to each other and connected at both ends by the two rounded side surfaces.

7. The method of claim 5, wherein the contact hole has four flat side surfaces, each one of the four flat side surfaces arranged parallel to another one of the four flat side surfaces.

8. The method of claim 1, wherein a first line segment drawn from a first point located above the first epitaxial layer and on a surface of the trench to a second point located above an edge of the first epitaxial layer is about 5 nm to about 30 nm long, wherein a second line segment drawn from a third point located above the first epitaxial layer and on the surface of the trench to a fourth point located above the edge of the first epitaxial layer is about 5 nm to about 30 nm long, and wherein the first line segment and the second line segment are substantially perpendicular to each other and are substantially parallel to the upper surface of the first epitaxial layer pattern.

9. The method of claim 1, wherein etching the second insulation interlayer to form the trench comprises:

forming a second photoresist film on the second insulation interlayer;

patterning the second photoresist film using a second reticle to form a second photoresist pattern that partially exposes the second insulation interlayer, the second photoresist pattern having an end that is positioned over the first epitaxial layer pattern; and etching the second insulation interlayer using the second photoresist pattern as an etching mask.

10. The method of claim 1, wherein etching the second insulation layer to form the trench that partially exposes the upper surface of the first epitaxial layer pattern at an end of the trench further comprises etching the second insulation layer to form the trench that partially exposes an upper surface of another first epitaxial layer pattern at another end of the trench.

11. The method of claim 1, wherein filling the contact hole with a first epitaxial layer pattern comprises:

growing single crystalline silicon from the surface of the semiconductor substrate by a selective epitaxial growth (SEG) process to form a first preliminary epitaxial layer pattern, the first preliminary epitaxial layer pattern having a dome shaped portion, the dome shaped portion having a bottom surface in contact with the upper surface of the first insulation interlayer; and planarizing an upper surface of the first preliminary epitaxial layer pattern.

12. The method of claim 1, wherein filling the trench with the second epitaxial layer pattern comprises:

growing single crystalline silicon from the upper surface of the first epitaxial layer pattern by a selective epitaxial growth (SEG) process to form a second preliminary epitaxial layer pattern; and planarizing an upper surface of the second preliminary epitaxial layer pattern to form the second epitaxial layer pattern.

13. A method of manufacturing a semiconductor device comprising:

depositing a first insulation interlayer on a semiconductor substrate and a lower transistor;

partially etching the first insulation interlayer to form a contact hole that partially exposes source/drain regions of the lower transistor;

filling the contact hole with a first epitaxial layer pattern;

depositing a second insulation interlayer on the first epitaxial layer pattern and the first insulation interlayer;

partially etching the second insulation interlayer to form a trench that partially exposes an upper surface of first epitaxial layer pattern, an end of the trench positioned over the first epitaxial layer pattern;

filling the trench with a second epitaxial layer pattern; and forming an upper transistor on the second epitaxial layer pattern.

* * * * *

UNITED STATES PATENT AND TRADEMARK OFFICE
CERTIFICATE OF CORRECTION

PATENT NO. : 7,510,952 B2
APPLICATION NO. : 11/335031
DATED : March 31, 2009
INVENTOR(S) : Hye-Soo Shin It is certified that error appears in the above-identified patent and that said Letters Patent is hereby corrected as shown below:

Column 4, line 67, the word "10a" should read --110--.

Signed and Sealed this

Thirteenth Day of July, 2010

David J. Kappos
*Director of the United States Patent and Trademark Office*